United States Patent [19]

Protic et al.

[11] 4,166,218

[45] Aug. 28, 1979

[54] P-I-N DIODE DETECTOR OF IONIZING RADIATION WITH ELECTRIC FIELD STRAIGHTENING

[75] Inventors: Davor Protic, Julich; Georg Riepe, Mechernich, both of Fed. Rep. of Germany

[73] Assignee: Kernforschungsanlage Julich Gesellschaft mit beschrankter Haftung, Julich, Fed. Rep. of Germany

[21] Appl. No.: 845,798

[22] Filed: Oct. 26, 1977

[30] Foreign Application Priority Data

Oct. 30, 1976 [DE] Fed. Rep. of Germany ....... 2650154

[51] Int. Cl.² .................... G01T 1/22; H01L 27/14; H01L 29/12
[52] U.S. Cl. .................................. 250/370; 357/29; 357/58
[58] Field of Search ................. 250/370, 371; 357/29, 357/58

[56] References Cited

U.S. PATENT DOCUMENTS

| 2,986,591 | 5/1961 | Swanson et al. | 357/58 |
| 3,410,737 | 11/1968 | Schuler | 357/58 |
| 3,620,827 | 11/1971 | Collet | 357/29 |

*Primary Examiner*—Davis L. Willis
*Assistant Examiner*—Janice A. Howell
*Attorney, Agent, or Firm*—William R. Woodward

[57] ABSTRACT

The distortion of the electric field in a p-i-n diode detector produced by electrically active layer build-up on the exposed surface of the i zone is removed by irradiating the exposed i zone surface with a light source having the intensity of a few milliwatts.

2 Claims, 3 Drawing Figures

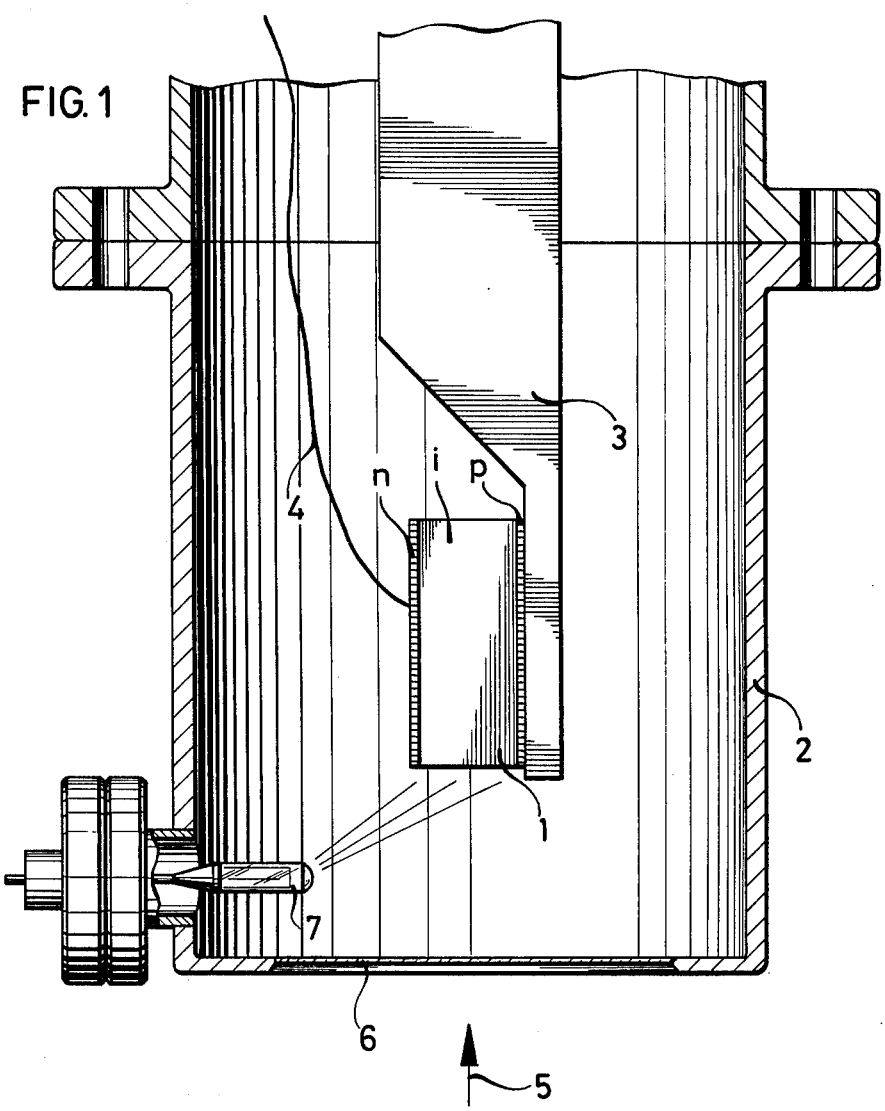

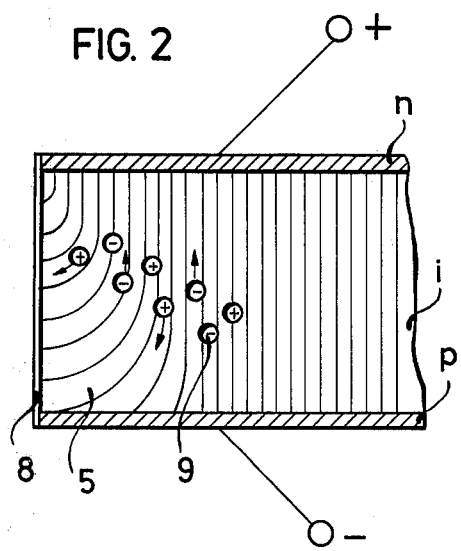
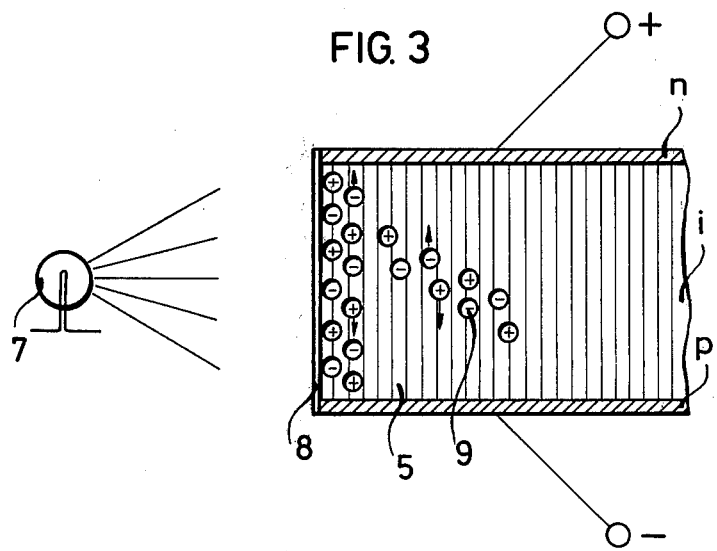

P-I-N DIODE DETECTOR OF IONIZING RADIATION WITH ELECTRIC FIELD STRAIGHTENING

This invention relates to apparatus for detecting or measuring ionizing radiation in which, in a casing opaque to light and operating as electrical shielding, a window is provided of a material transparent to the ionizing radiation and a semi-conductor diode is provided within the casing having an intrinsic conduction zone between the p and n type layers and having contacts and connections for applying an electrical field in the blocking direction of the diode, the diode being disposed so that its intrinsic conduction zone can be irradiated by the ionizing radiation to produce electron-hole pairs therein which, as a result of the electric field, produce electrical pulses that are furnished to a measuring or counting apparatus.

Such equipment with semi-conductor detectors of the type above described, which are sometimes referred to as p-i-n semi-conductor detectors—for example made of Si, Ge or CdTe—, are well known. The intrinsic conduction zone—the i region—is the volume or bulk of the detector that is sensitive to the ionizing radiation. This sensitivity arises because of the applied electrical voltage. Upon the incidence or penetration of the ionizing radiation on or into this sensitive volume of the semi-conductor, electron-hole pairs are formed and the electrons and the holes are collected by the electric field in the intrinsically conducting zone. The pulses generated in this fashion are supplied through contacts and circuit connections to a measuring or counting circuit.

In the ideal case, a semi-conductor diode of the above described type has a field distribution in the intrinsically conducting zone that is similar to that of a parallel plate capacitor with a uniform dielectric between the plates. In the case of large difference between the dielectric constant in the interior of the intrinsically conducting zone and the dielectric constant outside the zone, the lines of force of the field run almost parallel to the exposed edge of the intrinsically conducting zone. In practice, however, electrically active layers are laid down on the outer surface of the intrinsically conducting zone either as the result of chemical treatment, in manufacture of the semi-conducting diode, or by absorption. These lead to a more or less strong distortion of the configuration of the field in the intrinsic conduction zone, according to the concentration of the boundary layer. This has the consequence that in the portion of the intrinsic conduction zone that is adjacent to the deposited surface layer, at least a portion of the electron-hole pairs produced by the ionizing radiation are not registered in the counting or measuring circuits as a result of the distorted field configuration and thus do not participate in the measurement. The sensitive volume of the device is thus effectively reduced, which in application of the known apparatus for measuring of gamma rays leads to the reduction of the detection probability or even goes so far as to bring down to zero value the response probability for gamma rays of lower energy.

The disturbed portion of the intrinsic conduction zone thus acts as if it were a "dead" zone. There is the further disadvantage that the concentration of the adsorbed layers varies with time and leads to an inconstancy of the sensitive volume of the device. The result is also a deterioration of the time resolution for coincidence measurements. In addition, the disturbed field configuration has an unfavorable effect on the utilization of the known devices for measuring charged particles with respect to the resolution and the determination of energy of the particles.

THE PRESENT INVENTION

It is an object of the present invention to provide an apparatus in which the effect of electrically active layers deposited on the exposed surface of the intrinsically conducting zone of the semi-conductor diode is negligibly small.

Briefly, means are provided for irradiating the exposed surface of the intrinsically conducting zone with electro-magnetic radiation of such energy and intensity as to maximize the response probability of the diode for ionizing radiation consisting of gamma radiation and/or the resolution capability of the diode for ionizing radiation consisting of charged particles. As a particular preferred embodiment, the means for irradiating the exposed surface of the intrinsic conduction zone of the semi-conductor diode is a light source of an intensity of a few milliwatts.

The invention is based on the following considerations. By the irradiation of the intrinsic conduction zone with electro-magnetic radiation of suitable energy, electron-hole pairs are produced directly below its exposed surface. These electron-hole pairs reduce the influence of the electrically active layer formed or deposited on the outer exposed surface of the intrinsically conducting zone. They cause that effect to disappear entirely if the intensity of the electro-magnetic radiation is so chosen that the distortion of the electrical field resulting from the built on layers is exactly cleared or removed in the intrinsically conducting zone. In that case, the result is obtained that the electron-hole pairs formed by the ionizing radiation to be measured are fully detected in the measurement.

It is true that the energy and intensity of the electro-magnetic radiation to be chosen is different for each semi-conductor diode, because the accretion or other formation of the electrically active layers on the surface of the intrinsically conducting zone depends upon the kind of semi-conductor diode and its conditions of manufacture. It has been found, however, that in general the effect of the electrically active layers on the measurement of the ionizing radiation disappears if the means for irradiating the intrinsically conducting zone with electro-magnetic radiation consists of a light source of an intensity of a few milliwatts.

Drawing, illustrating an example, consisting of three figures:

FIG. 1 is a view, mainly in cross-section, and partly broken away at the top, of an apparatus embodying the invention utilizing a light source for irradiating the semi-conductor diode;

FIG. 2 is a diagram of the distorted field configuration in the semi-conductor diode produced by a layer of acceptors built up on the exposed surface of the intrinsic conduction zone, and FIG. 3 is a diagram of the field configuration the semi-conductor diode as corrected by the irradiation of the intrinsic conduction zone with electro-magnetic radiation.

As shown in FIG. 1, the semi-conductor diode 1 is located in a casing 2 that is constituted as a cryostat casing. The semi-conductor diode 1 is mounted on a holder 3 constituted as a cooling finger and is connected by a wire lead 4 with a measurement and/or counting apparatus not shown in the drawing. Over the connection 4 there is provided to the semi-conductor diode 1 on the one hand the necessary bias voltage for operation of the diode and on the other hand a path for leading the pulses produced by the ionizing radiation directly to a preamplifier in the measuring circuit already mentioned that is not shown in the drawing.

As may be further seen in FIG. 1, a window 6 that is transparent for the ionizing radiation 5 is so arranged that the ionizing radiation 5 that is to be measured impinges directly on the intrinsically conducting zone i. To one side of the window, inside the casing, is located the device 7 constituted as a light source from which light rays are emitted directly onto the intrinsically conducting zone i of the semi-conductor diode.

As shown in FIG. 2, the field configuration of the semi-conductor diode is strongly bent by the effect of the layer 8 of acceptors accumulated on the surface. A part of these bent lines of force end on the layer 8, which has the consequence that the electron-hole pairs 9 generated by the ionizing radiation 5 in the region of these bent lines of force are not registered as pulses by the measuring and counting circuit not shown in the drawing and, consequently, do not participate in the measurement of the ionizing radiation. In contrast, as shown in the field configuration in FIG. 3, the lines of force located in the region of influence of the accumulated layer 8 are straightened out by the effect of the electro-magnetic radiation. This has the result that even in this region of the field the electron-hole pairs 9 produced by the ionizing radiation 5 participate in the measurement. The noise level produced by the electro-magnetic radiation is in general negligible.

EXAMPLE

For measurement of a beam of 155 million electron volt particles planar Ge (Li) detectors of the "side-entry" type were used and the exposed surfaces of their intrinsic conduction zones were illuminated by a light source consisting of a 24 V, 1.2 watt incandescent light bulb operated at an undervoltage of 6 V in order to maximize the energy-resolution of the particle detection. The distance between the light bulb and the face of the intrinsic conduction zone was 15 cm.

We claim:
1. Apparatus for detecting or measuring ionizing radiation comprising:
   a semi-conductor diode having an intrinsically conducting zone between a p-type conduction layer and an n-type conduction layer and provided with connections for applying an electrical field in the blocking direction of the diode;
   a casing surrounding said diode of material opaque to light and effective to provide electrical shielding, said casing having a window transparent for the ionizing radiation for irradiating therewith said intrinsic zone of said diode between said p-type and n-type layers so as to produce electron-hole pairs therein and to generate electrical pulses as the result of said electrical field;
   means for counting said pulses connected to said diode, and
   means (7) for irradiating said intrinsic conduction zone (i) with electro-magnetic radiation of such energy and intensity as to increase to a maximum the response probability of said diode (1) for an ionizing radiation consisting of gamma rays and/or for increasing to a maximum the resolving capability of said diode for ionizing radiation consisting of charged particles.
2. Detecting or measuring apparatus as defined in claim 1 in which said means (7) for irradiating said intrinsic conduction zone (i) with electro-magnetic radiation consists of a source of visible light of a power of a few milliwatts.

* * * * *